(12) United States Patent
Xie et al.

(10) Patent No.: US 8,772,101 B2
(45) Date of Patent: Jul. 8, 2014

(54) METHODS OF FORMING REPLACEMENT GATE STRUCTURES ON SEMICONDUCTOR DEVICES AND THE RESULTING DEVICE

(71) Applicants: GLOBALFOUNDRIES Inc., Grand Cayman, KY (US); International Business Machines Corporation, Armonk, NY (US)

(72) Inventors: Ruilong Xie, Niskayuna, NY (US); Ponoth Shom, Gaithersburg, MD (US); Cho Jin, Palo Alto, CA (US); Charan Veera Venkata Satya Surisetty, Clifton Park, NY (US)

(73) Assignees: GLOBALFOUNDRIES Inc., Grand Cayman (KY); International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/671,940

(22) Filed: Nov. 8, 2012

(65) Prior Publication Data

US 2014/0124841 A1    May 8, 2014

(51) Int. Cl.
*H01L 21/8238* (2006.01)

(52) U.S. Cl.
USPC ........... 438/199; 438/788; 438/926; 438/183; 438/900; 257/319; 257/288; 257/369; 257/410; 257/386; 257/387; 257/900

(58) Field of Classification Search
USPC .......... 438/788, 926, 183, 900, 199; 257/319, 257/288, 369, 410, 386, 387, 900
See application file for complete search history.

(56) References Cited

U.S. PATENT DOCUMENTS

| | | | |
|---|---|---|---|
| 5,973,356 A * | 10/1999 | Noble et al. | 257/319 |
| 6,465,823 B1 * | 10/2002 | Yagishita et al. | 257/288 |
| 6,664,592 B2 * | 12/2003 | Inumiya et al. | 257/330 |
| 7,812,411 B2 * | 10/2010 | Cheng | 257/410 |
| 2002/0066941 A1 * | 6/2002 | Aoki | 257/635 |
| 2005/0272191 A1 * | 12/2005 | Shah et al. | 438/197 |
| 2006/0255469 A1 * | 11/2006 | Eimori | 257/774 |
| 2007/0090417 A1 * | 4/2007 | Kudo | 257/288 |
| 2008/0157146 A1 * | 7/2008 | Kim et al. | 257/292 |

(Continued)

OTHER PUBLICATIONS

Lis et al., Application of flowable oxides in photonics, 2008, Materials Science-Poland, vol. 26, No. 1, 189-194.*

(Continued)

*Primary Examiner* — Zandra Smith
*Assistant Examiner* — Sophia Nguyen
(74) *Attorney, Agent, or Firm* — Amerson Law Firm, PLLC

(57) ABSTRACT

One method includes forming first sidewall spacers adjacent opposite sides of a sacrificial gate structure and a gate cap layer, removing the gate cap layer and a portion of the first sidewall spacers to define reduced-height first sidewall spacers, forming second sidewall spacers, removing the sacrificial gate structure to thereby define a gate cavity, whereby a portion of the gate cavity is laterally defined by the second sidewall spacers, and forming a replacement gate structure in the gate cavity, wherein at least a first portion of the replacement gate structure is positioned between the second sidewall spacers. A device includes a gate structure positioned above the substrate between first and second spaced-apart portions of a layer of insulating material and a plurality of first sidewall spacers, each of which are positioned between the gate structure and on one of the first and second portions of the layer of insulating material.

15 Claims, 13 Drawing Sheets

(56) References Cited

U.S. PATENT DOCUMENTS

| | | | |
|---|---|---|---|
| 2008/0315318 A1* | 12/2008 | Sato et al. | 257/369 |
| 2009/0104789 A1* | 4/2009 | Mallick et al. | 438/788 |
| 2011/0253965 A1* | 10/2011 | Liu | 257/2 |
| 2012/0043623 A1* | 2/2012 | Doris et al. | 257/410 |
| 2012/0264286 A1* | 10/2012 | Yeo | 438/595 |

OTHER PUBLICATIONS

Lee et al., Low Temperature Silicon Nitride and Silicon Dioxide Film Processing by Inductively Coupled Plasma Chemical Vapor Deposition, 2000, Journal of the Electrochemical Society, vol. 147, No. 4, 1481-1486.*

* cited by examiner

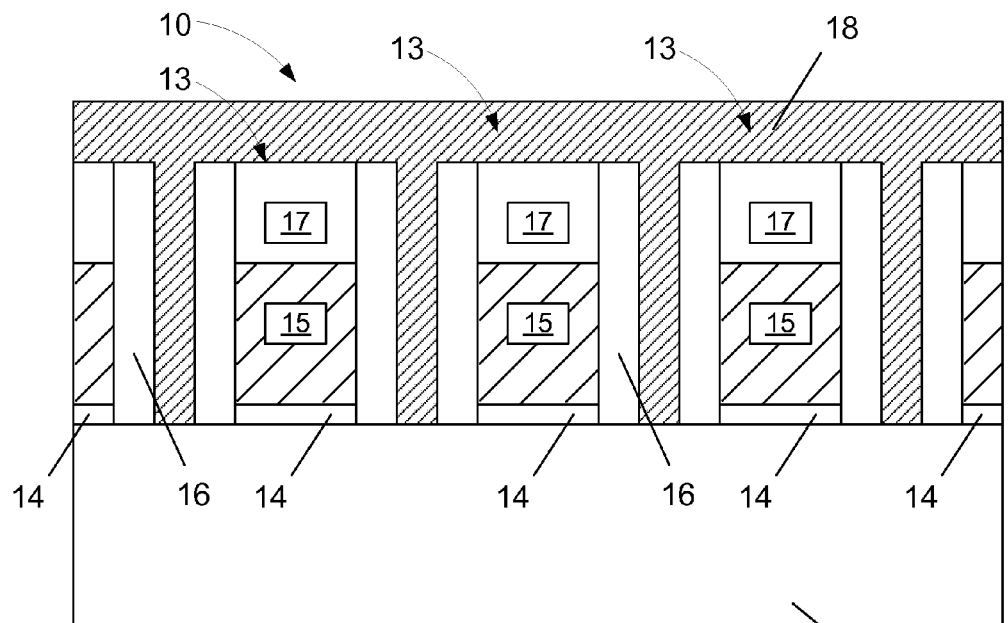
(Prior Art) Figure 1A
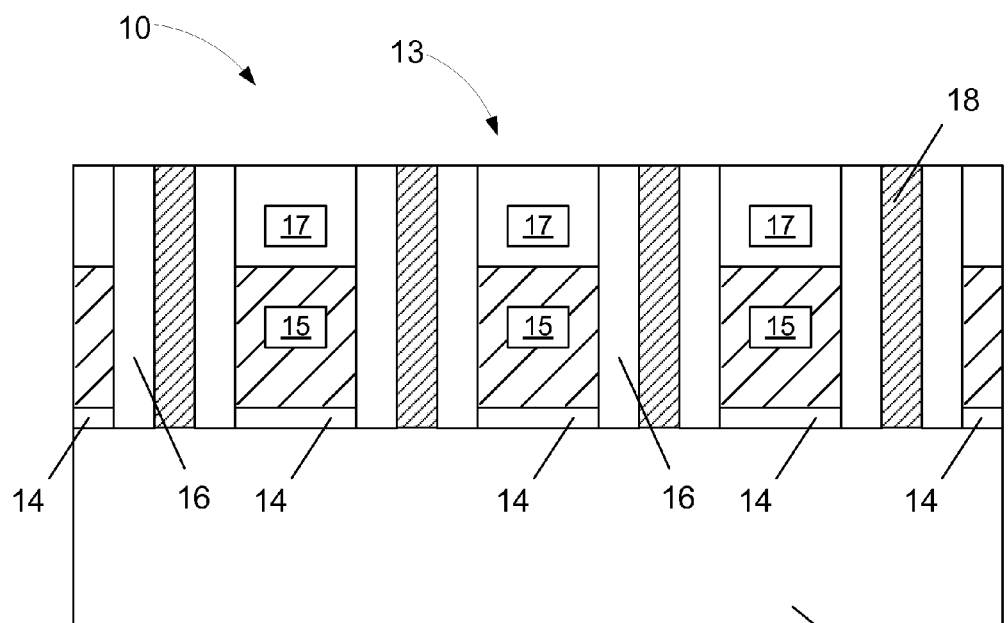
(Prior Art) Figure 1B

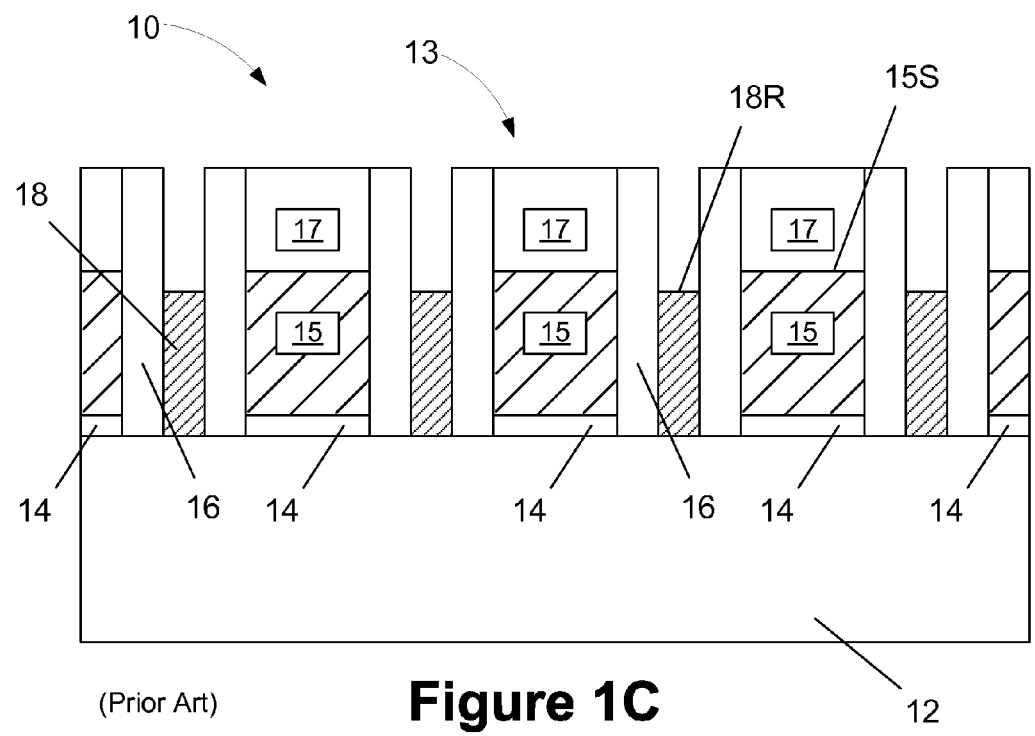
(Prior Art) Figure 1C
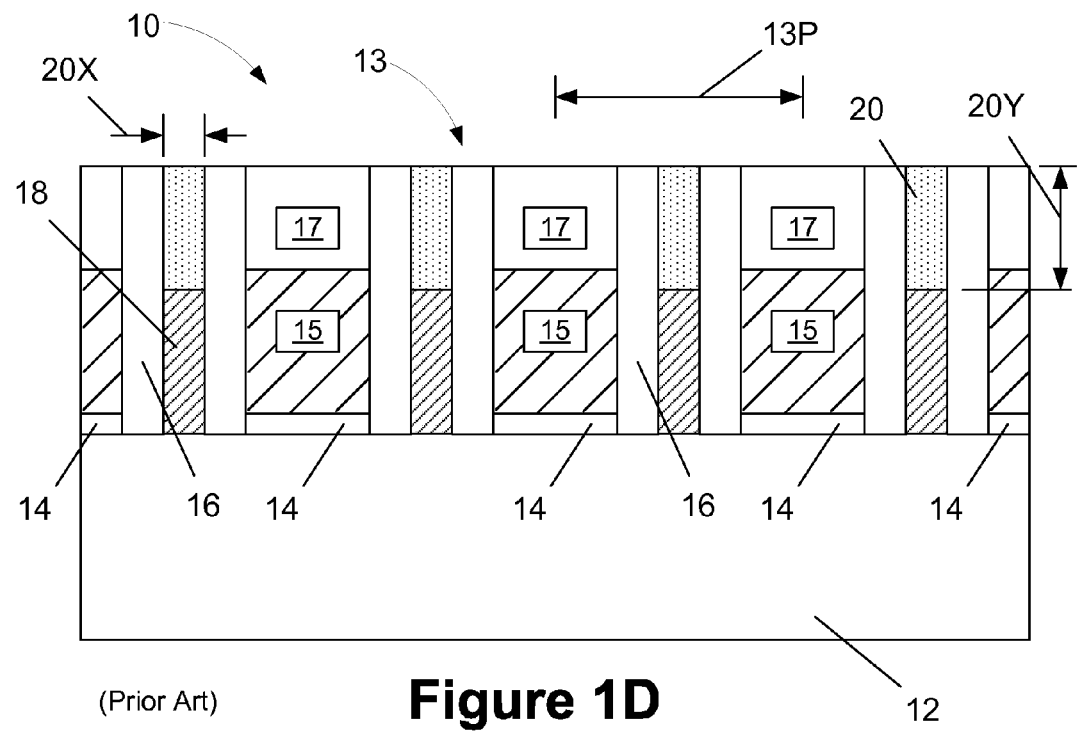
(Prior Art) Figure 1D

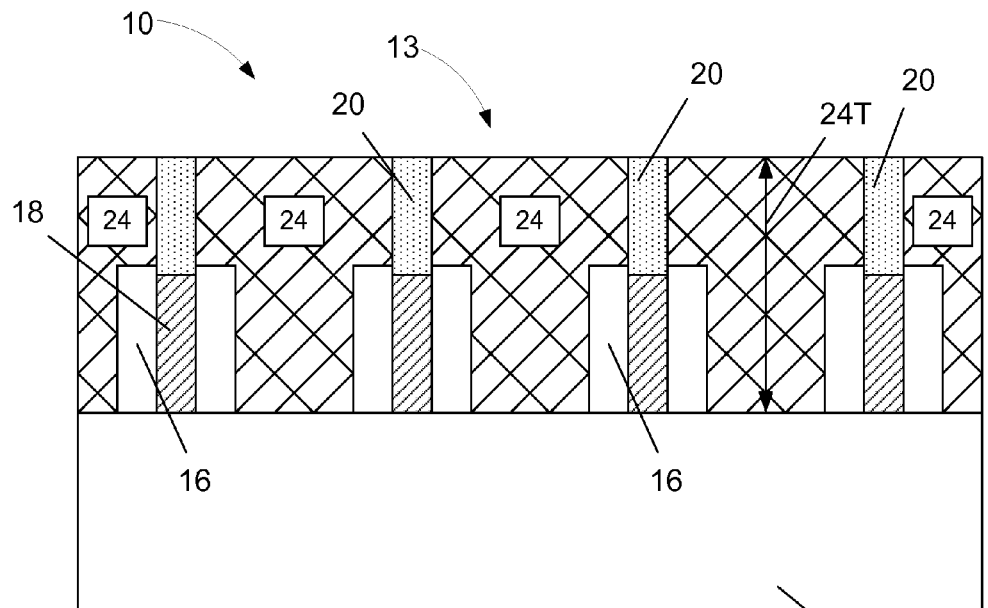
(Prior Art) Figure 1G
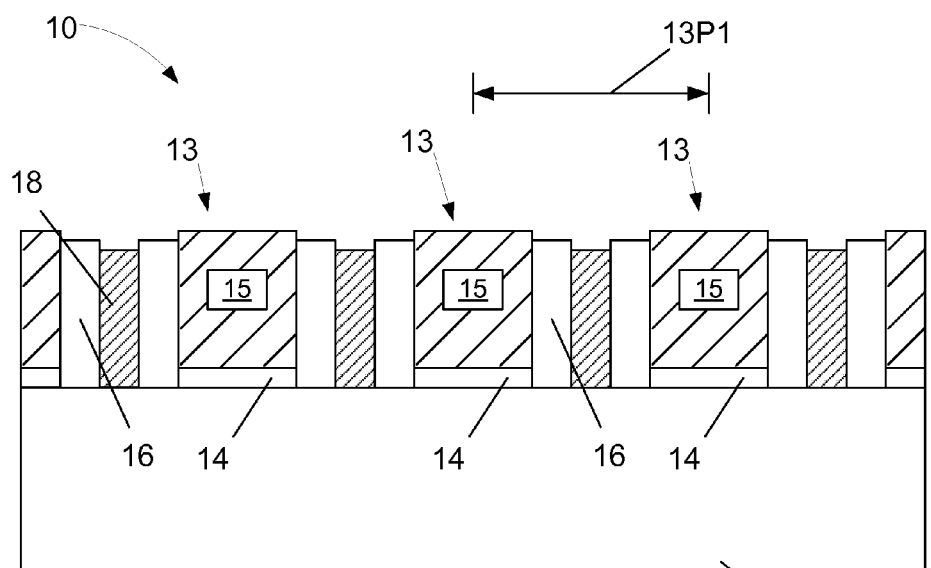
(Prior Art) Figure 1H

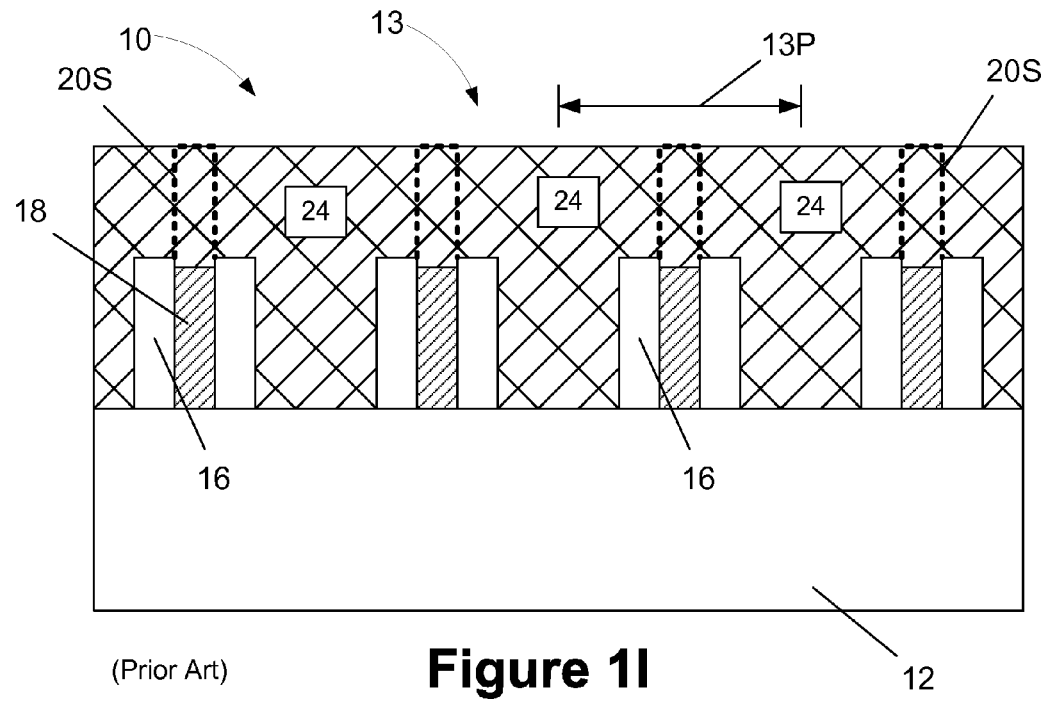
(Prior Art) Figure 1I
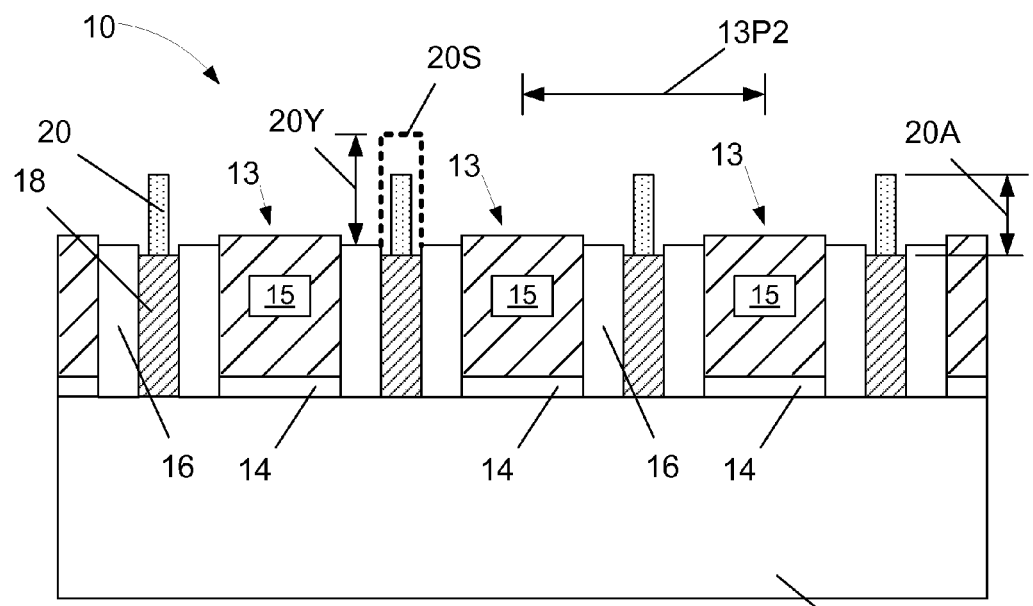
(Prior Art) Figure 1J

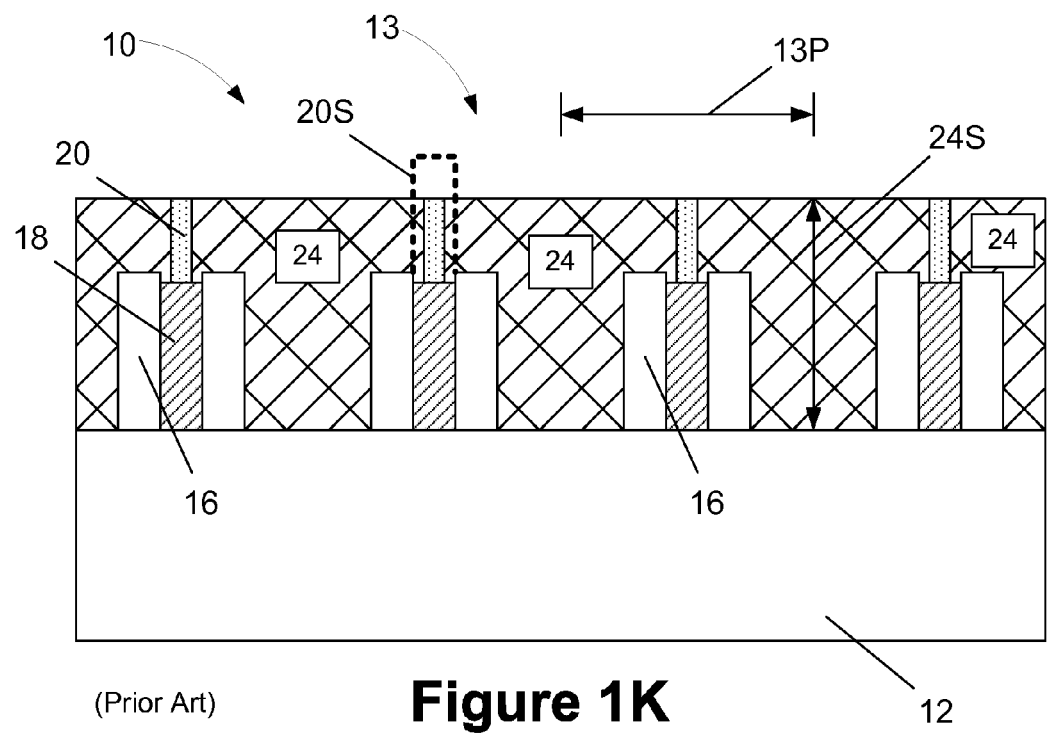
(Prior Art) Figure 1K

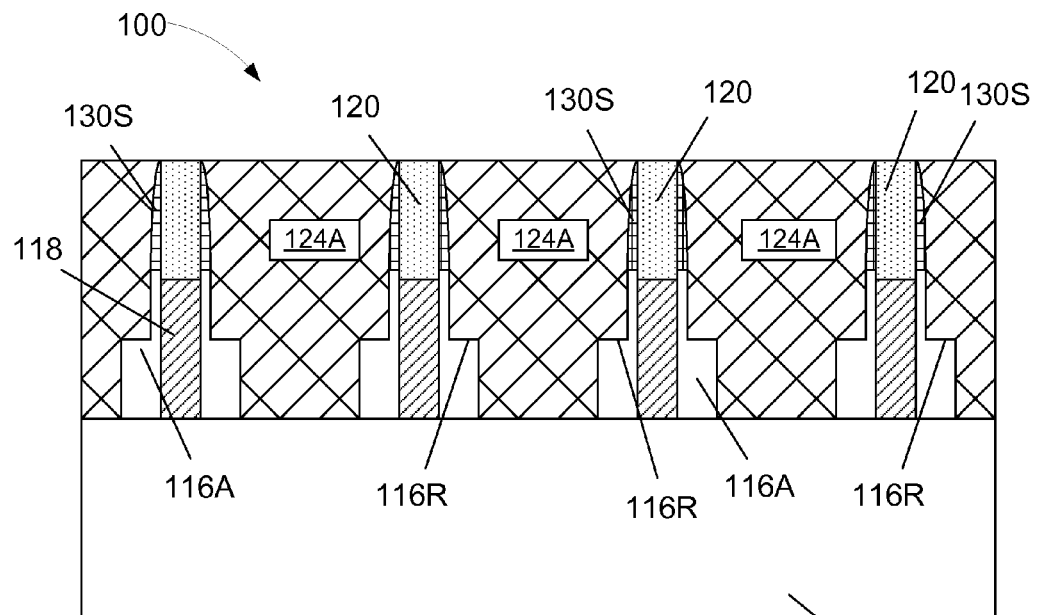
Figure 3D
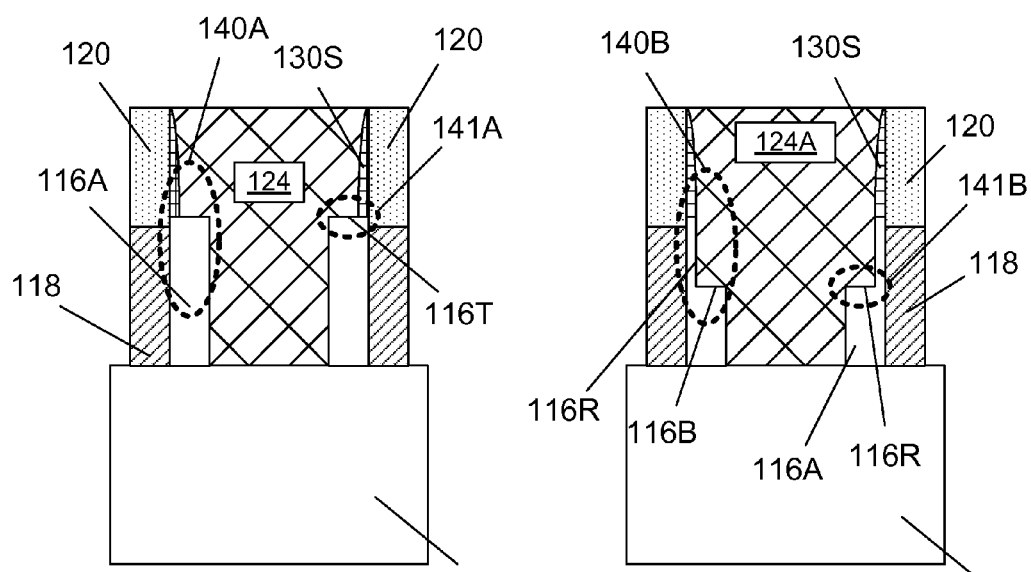
Figure 4A  Figure 4B

METHODS OF FORMING REPLACEMENT GATE STRUCTURES ON SEMICONDUCTOR DEVICES AND THE RESULTING DEVICE

BACKGROUND OF THE INVENTION

1. Field of the Invention

Generally, the present disclosure relates to the manufacture of sophisticated semiconductor devices, and, more specifically, to various methods of forming replacement gates structures on semiconductor devices and various semiconductor devices with replacement gates made using such methods.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region. Current flow through the FET is controlled by controlling the voltage applied to the gate electrode. If there is no voltage applied to the gate electrode, then there is no current flow through the device (ignoring undesirable leakage currents, which are relatively small). However, when an appropriate voltage is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. More specifically, in a FinFET, a generally vertically positioned fin-shaped active area is formed and a gate electrode encloses both sides and an upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects.

For many early device technology generations, the gate structures of most transistor devices, whether a planar device or a 3D device, have been comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-20 nm or less, gate structures that include a so-called high-k dielectric gate insulation layer and one or more metal layers that function as the gate electrode (HK/MG) have been implemented. Such alternative gate structures have been shown to provide significantly enhanced operational characteristics over the heretofore more traditional silicon dioxide/polysilicon gate structure configurations.

Depending on the specific overall device requirements, several different high-k materials—i.e., materials having a dielectric constant, or k-value, of approximately 10 or greater—have been used with varying degrees of success for the gate insulation layer in an HK/MG gate electrode structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

One well-known processing method that has been used for forming a transistor with a high-k/metal gate structure is the so-called "gate last" or "replacement gate" technique. The replacement gate technique has been employed on both planar and 3D devices, like FinFETs. In the replacement gate technique, a so-called "dummy" or sacrificial gate structure is initially formed and remains in place as many process operations are performed to form the device, e.g., the formation of doped source/drain regions, performing an anneal process to repair damage to the substrate caused by the ion implantation processes and to activate the implanted dopant materials. At some point in the process flow, the sacrificial gate structure is removed to define a gate cavity where the final HK/MG gate structure for the device is formed.

FIGS. 1A-1K depict one illustrative prior art method for forming an HK/MG replacement gate structure using a replacement gate technique. As shown in FIG. 1A, an integrated circuit device 10 is comprised of a plurality of illustrative sacrificial gate structures 13. Each of the sacrificial agate structures 13 is comprised of a sacrificial gate insulation layer 14, e.g., a layer of silicon dioxide, and a sacrificial gate electrode 15, e.g., a layer of polysilicon. A gate cap layer 17, e.g., a layer of silicon nitride, is positioned above the sacrificial gate electrode 15. At the point of fabrication depicted in FIG. 1A, a layer of insulating material 18, e.g., a layer of flowable silicon dioxide, has been formed on the device 10. The sacrificial gate structures 13 and the gate cap layers 17 may be formed by forming the various layers of material across the substrate 12 and thereafter patterning the layers of material. The sidewall spacers 16 may then be formed by conformably depositing a layer of spacer material and thereafter performing an anisotropic etching process. The layer of insulating material 18 may be formed by performing a chemical vapor deposition process.

FIG. 1B depicts the device 10 after a chemical mechanical polishing (CMP) process has been performed to remove excess portions of the layer of insulating material 18 and to expose the gate cap layer 17. As shown in FIG. 1C, an etching process has been performed to remove a portion of, or recess, the layer of insulating material 18. The etching process is performed such that, after etching, the recessed surface 18R of the layer of insulating material 18 is positioned below the upper surface 15S of the sacrificial gate electrode 15. The material selected for the layer of insulating material 18 is typically selected based upon its ability to reliably fill the very small spaces between spacers 16 on adjacent replacement gate structures 13 as shown in FIG. 1A, e.g., a flowable oxide material may be the material selected for the layer of insulating material 18. While such a material may have good "fill" capabilities, it exhibits relatively poor etch selectivity when subjected to an etching process that will be performed later to remove silicon nitride materials. Thus, an upper portion of the layer of insulating material 18 is removed and replaced with a layer of insulating material that exhibits a better etch selectivity when exposed to an etching process that is performed to remove silicon nitride.

FIG. 1D depicts the device 10 after a layer of insulating material 20, e.g., an HDP oxide, has been deposited on the device and after a CMP process has been performed to remove excess amounts of the layer of insulating material 20. The CMP process exposes the cap layers 17 and spacers 16 for further processing. As shown in FIG. 1E, an etching process has been performed to remove the gate cap layers 17 and portions of the sidewall spacers 16. This etching process exposes the sacrificial gate electrodes 15 for further processing. FIG. 1F depicts the device 10 after one or more etching processes have been performed to remove the sacrificial gate electrode 15 and the sacrificial gate insulation layer 14 to thereby define a gate cavity 22 where a replacement gate structure will subsequently be formed. Typically, the sacrificial gate insulation layer 14 is removed as part of the replacement gate technique, as depicted herein. However, the sacrificial gate insulation layer 14 may not be removed in all applications. FIG. 1G depicts the device 10 after schematically depicted replacement gate structures 24 have been formed in the gate cavities 22. The materials used for such replacement gate structures 24 may vary depending upon the particular application. Even in cases where the sacrificial gate insulation layer 14 is intentionally removed, there will typically be a very thin native oxide layer (not shown) that forms on the substrate 12 within the gate cavity 22. In one illustrative example, the replacement gate structure 24 is comprised of a high-k gate insulation layer, such as hafnium oxide, and one or more layers of metal. The layers of material that comprise the replacement gate structure 24 are sequentially deposited in the gate cavities 22 and one or more CMP processes are performed to remove excess portions of these layers of material to thereby arrive at the replacement gate structures 24 depicted in FIG. 1G, wherein the upper portions of the replacement gate structure 24 are separated from one another by the insulating material 20.

The aforementioned process flow is not without problems. As part of the process of forming the replacement gate structures 24, the device will typically be subjected to a pre-clean process, usually with HF acid, to insure that all non-desired materials are removed from the surface of the substrate 12 prior to forming the layers of material that will be part of the replacement gate structure 24. While the layer of insulating material 20 does exhibit better etch selectivity than the layer of insulating material 18 when exposed prior to an etching process designed to remove silicon nitride, the layer of insulating material 20 may be severely degraded or substantially consumed when exposed to this pre-clean process that uses HF acid. This becomes problematic as the gate pitch 13P (see FIG. 1D) on devices continues to shrink. For example, width 20X (see FIG. 1D) of the upstanding portions of the layer of insulating material 20 increases as the gate pitch 13P increases. Conversely, the width 20X decreases as the gate pitch 13P decreases. The thinner the width 20X, the more likely the upstanding portions of the layer of insulating material 20 may be completely consumed during the HF acid pre-clean process.

Although not drawn to scale, FIG. 1H depicts the situation where the gate pitch 13P1 is so small that all of the upstanding portions of the layer of insulating material 20 are consumed during the HF acid pre-clean process—compare FIGS. 1E and 1H. FIG. 1I depicts the device 10 after the replacement gate structures 24 have been formed on the device shown in FIG. 1H. Note dashed lines 20S indicate the absence of the upstanding portions of the layer of insulating material 20. As a result, excessive metal gate CMP is needed, otherwise there is no electrical isolation between the replacement gate structures 24 and the device will not operate as intended. In general, some of the problems associated with the loss or reduction in size of the upstanding portions of the layer of insulating material 20 is (1) loss of gate height and (2) it causes variations in the gate height of narrow-pitch devices and relaxed-pitch devices. In modern semiconductor device manufacturing, it is very common to use transistors that are formed with different pitches on the same substrate. The aforementioned difference in height in the final gate structures can create problems in later manufacturing operations that are performed to complete the device 10, e.g., CMP processes, etc.

Complete loss of the upstanding portions of the layer of insulating material 20 is not the only problem associated with the above-described prior art process flow. Although not drawn to scale, FIG. 1J depicts the situation where there is not a complete loss of the upstanding portions of the layer of insulating material 20. More specifically, in FIG. 1J, the gate pitch 13P2 is not so small that all of the upstanding portions of the layer of insulating material 20 are consumed during the HF acid pre-clean process. Nevertheless, the overall height 20A of the upstanding portions of the layer of insulating material 20 after the HF acid pre-clean process is complete is less than the height 20Y of the upstanding portions of the layer of insulating material 20 prior to the HF acid pre-clean process being performed—compare FIGS. 1D and 1J. FIG. 1K depicts the device 10 after the replacement gate structures 24 have been formed on the device shown in FIG. 1J. Note dashed lines 20S indicate the absence of the upstanding portions of the layer of insulating material 20. In the incomplete loss situation, the reduction in the size, i.e., width of the upstanding portions of the layer of insulating material 20, ultimately results in a narrower opening for a subsequent contact to land on the underlying source/drain region, thereby making processing more difficult and more likely to result in processing errors due to misalignment, incomplete or poor contact formation, etc. Additionally, even in the incomplete loss situation, due to the reduction in height of the upstanding portions of the layer of insulating material 20 after the silicon nitride etching process, the replacement gate structures 24 in FIG. 1K have a height 24S that is shorter than other gate structures on the device that have larger gate pitch dimensions. FIG. 1G depicts a final gate structure 24 that has a height 24T that is greater than the height 24S.

The present disclosure is directed to various methods of forming replacement gate structures on semiconductor devices and various semiconductor devices with replacement gates made using such methods that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming replacement gate structures on semiconductor devices and various semiconductor devices with replacement gates made using such methods. One illustrative method disclosed herein includes forming a gate cap layer above a sacrificial gate structure, forming first sidewall spacers adjacent opposite sides of the sacrificial gate structure and the gate cap layer, forming a layer of insulating material adjacent each of the first sidewall spacers, performing at least one etching process to remove the gate cap layer and a portion of the first sidewall spacers so as to expose portions of the layer of insulating material and to define reduced-height first sidewall spacers, forming second sidewall spacers on the exposed portions of the layer of insulating material, removing the sacrificial gate structure to thereby define a gate cavity, whereby a portion of the gate cavity is laterally defined by the second sidewall spacers, and forming a replacement gate structure in the gate cavity, wherein at least a first portion of the replacement gate structure is positioned between the second sidewall spacers.

One example of a novel device disclosed herein includes first and second spaced-apart portions of a first layer of insulating material positioned above a substrate, a gate structure positioned above the substrate between the first and second spaced-apart portions of the first layer of insulating material, a plurality of first sidewall spacers, each of which are positioned between the gate structure and on one of the first and second spaced-apart portions of the first layer of insulating material, and a second sidewall spacer positioned below each of the first sidewall spacers, wherein the first sidewall spacer contacts the second sidewall spacer.

BRIEF DESCRIPTION OF THE DRAWINGS

The disclosure may be understood by reference to the following description taken in conjunction with the accompanying drawings, in which like reference numerals identify like elements, and in which:

FIGS. 1A-1K depict one illustrative example of a prior art replacement gate processing technique for forming replacement gate structures on semiconductor devices;

FIGS. 3A-3D depict another illustrative novel method disclosed herein for forming replacement gate structures on semiconductor devices; and FIGS. 4A-4B depict illustrative embodiments of the novel gate structures disclosed herein.

Figure 1E:
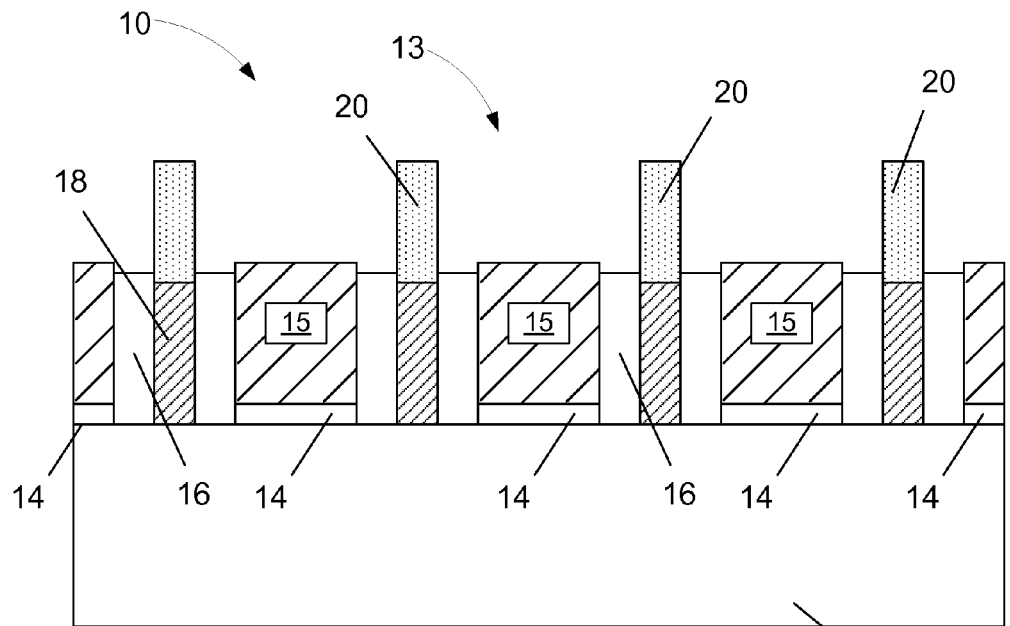
Figure 1F:
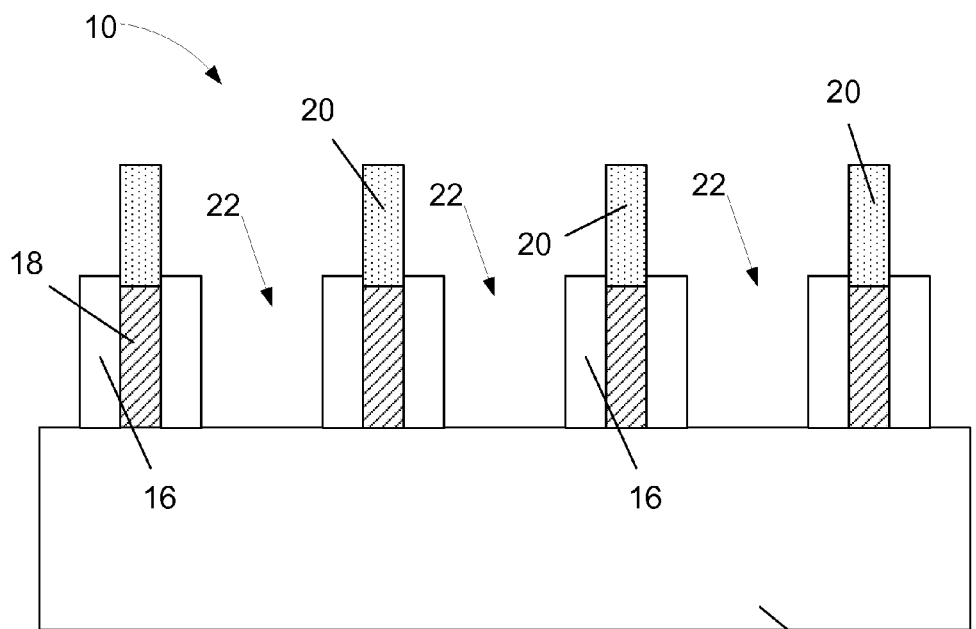

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming replacement gate structures on semiconductor devices and various semiconductor devices with replacement gates made using such methods. As will be readily apparent to those skilled in the art upon a complete reading of the present application, the methods disclosed herein may be employed with a variety of different technologies, e.g., NMOS, PMOS, CMOS, etc., and in manufacturing a variety of different devices, including, but not limited to, logic devices, memory devices, etc. With reference to the attached figures, various illustrative embodiments of the methods and devices disclosed herein will now be described in more detail.

In general, the present disclosure is directed to various methods of forming replacement gate structures on semiconductor devices and various semiconductor devices with replacement gates made using such methods. As will be appreciated by those skilled in the art after a complete reading of the present application, the inventions disclosed herein may be employed in forming planar transistor devices (NFET or PFET devices), as well as so-called 3D devices, such as FinFETs. For purposes of disclosure, reference will be made to an illustrative process flow for forming a planar transistor device. However, the inventions disclosed herein should not be considered to be limited to such an illustrative example.

Figure 2A:
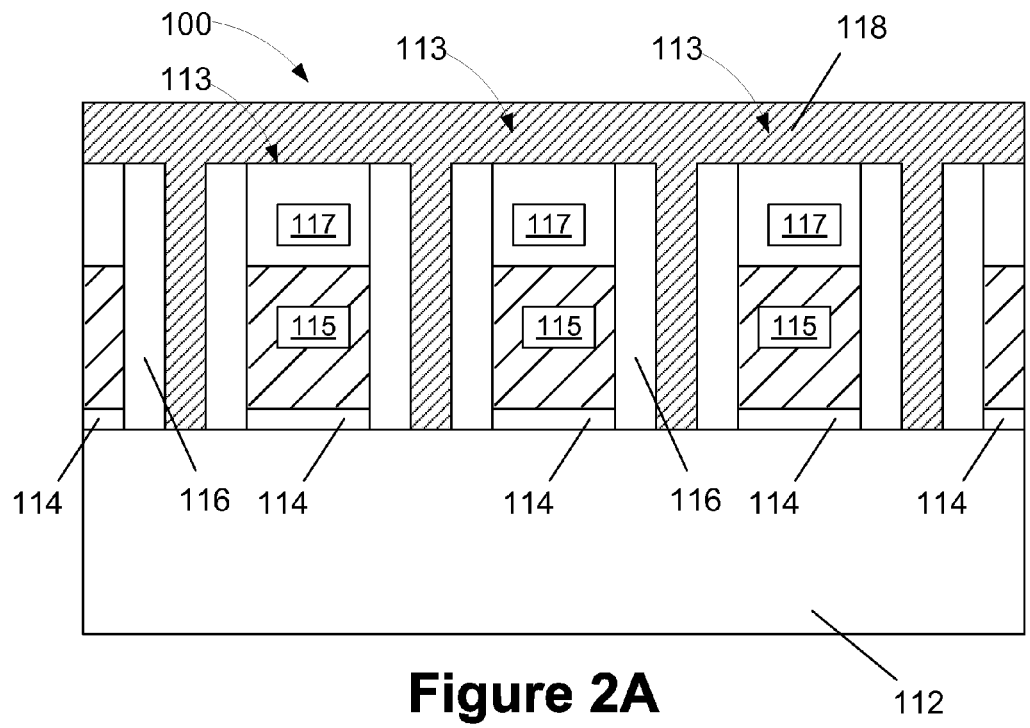
FIGS. 2A-2I depict one illustrative novel method disclosed herein for forming replacement gate structures on semiconductor devices.

FIG. 2A is a simplified view of an illustrative integrated circuit device 100 at an early stage of manufacturing. The device 100 is formed above an illustrative semiconducting substrate 112. The substrate 112 may have a variety of configurations, such as the depicted bulk silicon configuration. The substrate 112 may also have a silicon-on-insulator (SOI) or silicon/germanium-on-insulator (SGOI) configuration that includes a bulk silicon layer, a buried insulation layer and an active layer, wherein semiconductor devices are formed in and above the active layer. The substrate 112 may be made of silicon or it may be made of materials other than silicon. Thus, the terms "substrate" or "semiconducting substrate" should be understood to cover all semiconducting materials and all forms of such materials. So as not to obscure the inventions disclosed herein, isolation regions that are formed in the substrate to define active regions where transistors will be formed are not depicted in the attached drawings.

FIGS. 2A-2I depict one illustrative method disclosed herein for forming a replacement gate structure using a novel replacement gate technique. As shown in FIG. 2A, an integrated circuit device 100 is comprised of a plurality of illustrative sacrificial gate structures 113. Each of the sacrificial gate structures 113 is comprised of a sacrificial gate insulation layer 114, e.g., a layer of silicon dioxide, and a sacrificial gate electrode 115, e.g., a layer of polysilicon or amorphous silicon. A gate cap layer 117, e.g., a layer of silicon nitride, is positioned above the sacrificial gate electrode 115. At the point of fabrication depicted in FIG. 2A, a layer of insulating material 118, e.g., a layer of flowable silicon dioxide, has been formed on the device 100.

The layers of material depicted in FIG. 2A may be formed by any of a variety of different known techniques, e.g., a chemical vapor deposition (CVD) process, an atomic layer deposition (ALD) process, a thermal growth process, etc. The sacrificial gate structures 113 and the gate cap layers 117 may be formed by forming the various layers of material across the substrate 112 and thereafter patterning the layers of material using known photolithography and etching processes. The sidewall spacers 116 may then be formed by conformably depositing a layer of spacer material and thereafter performing an anisotropic etching process. The spacers 116 may have a thickness of about 7-15 nm. Of course, those skilled in the art will recognize that there are other features of the device 100 that are not depicted in the drawings so as not to obscure the present invention. For example, so-called halo implant regions, source/drain implant regions and various layers or regions of silicon/germanium that are typically found in high performance PFET transistors are not depicted in the drawings.

Figure 2B:
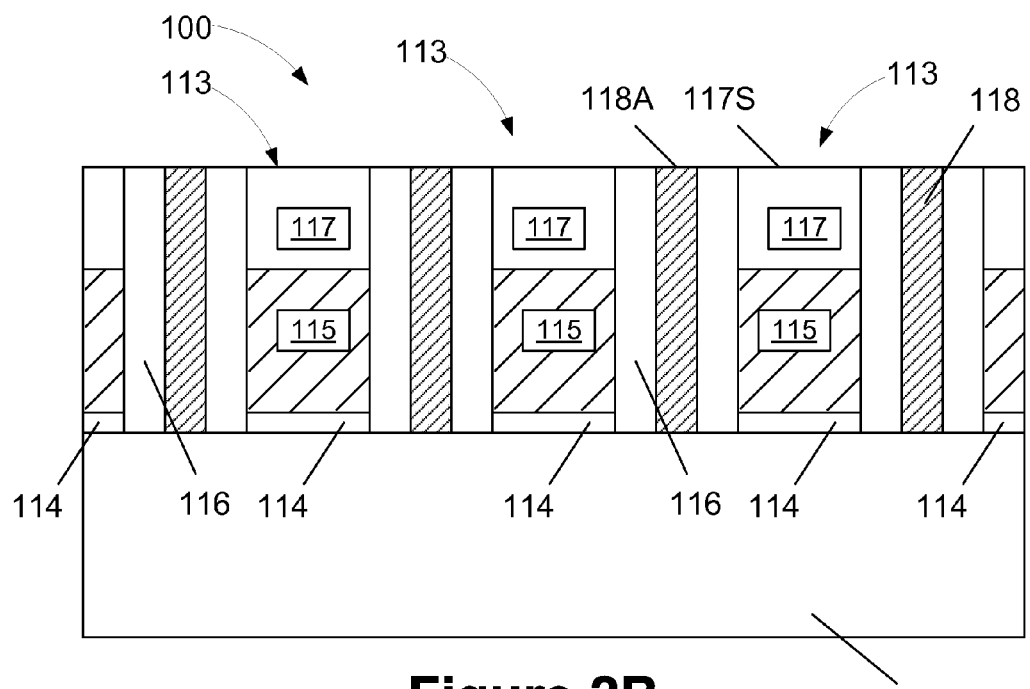

FIG. 2B depicts the device 100 after a chemical mechanical polishing (CMP) process has been performed to remove excess portions of the layer of insulating material 118 and to expose the gate cap layers 117. After this process, the upper surface 118A of the layer of insulating material 118 is substantially planar with the upper surface 117S of the gate cap layers 117. The material selected for the layer of insulating material 118 is typically selected based upon its ability to reliably fill the very small spaces between spacers 116 on adjacent replacement gate structures 113 as shown in FIG. 2A, e.g., a flowable oxide material may be the material selected for the layer of insulating material 118.

Figure 2C:
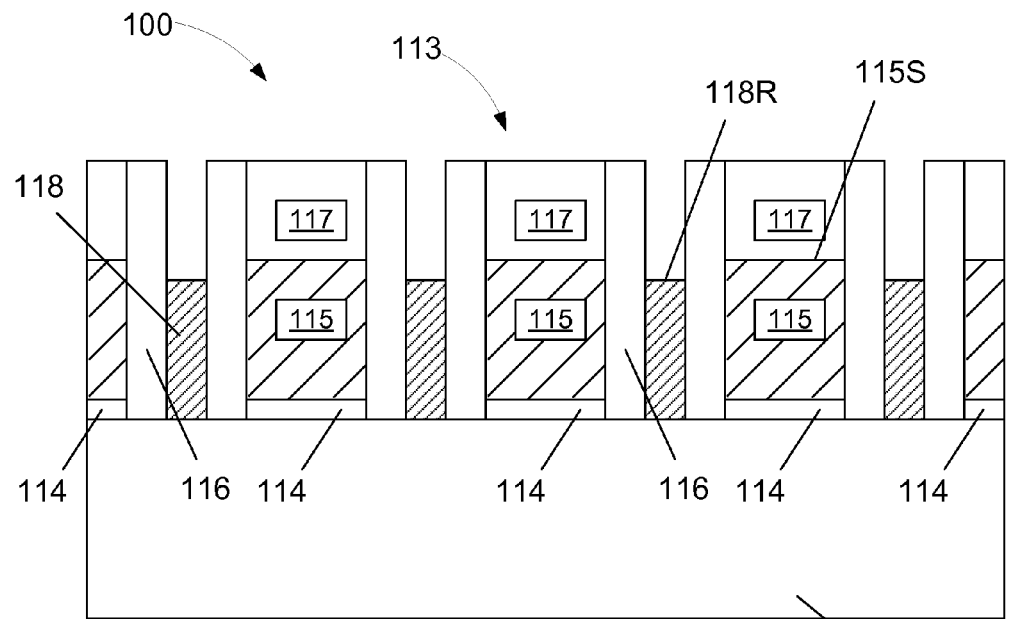

Next, as shown in FIG. 2C, an etching process has been performed to remove a portion of, or recess, the layer of insulating material 118. The etching process is performed such that, after etching, the recessed surface 118R of the layer of insulating material 118 is positioned below the upper surface 115S of the gate electrode 115. The upper portion of the layer of insulating material 118 is removed so that it may be replaced with a layer of insulating material that exhibits a better etch selectivity than does the layer of insulating material 118 when exposed to an etching process that is performed to remove silicon nitride.

Figure 2D:
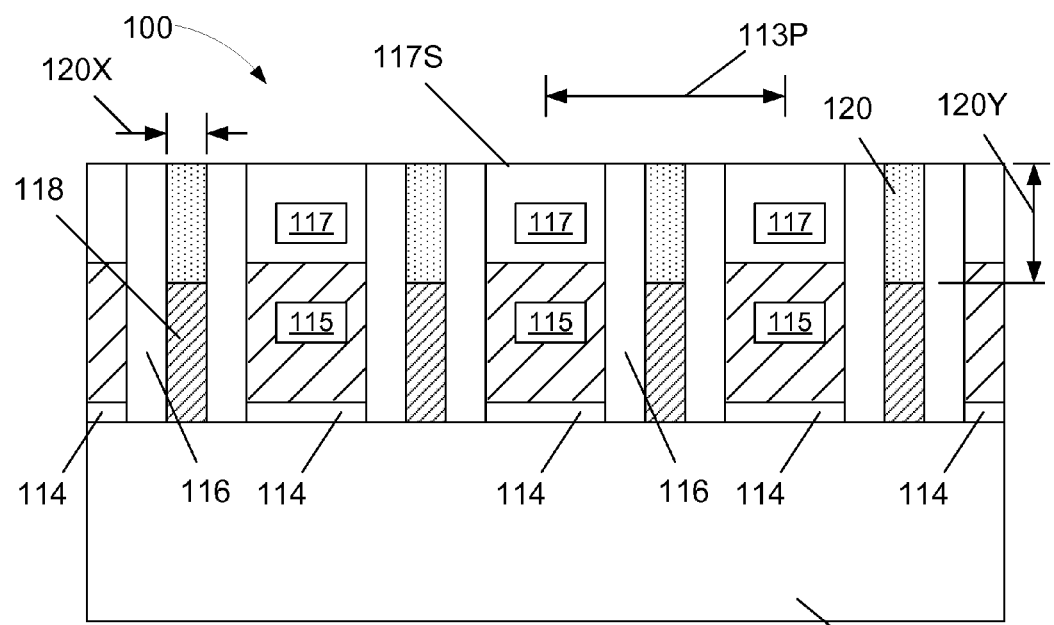

FIG. 2D depicts the device 100 after a layer of insulating material 120, e.g., an HDP oxide, has been deposited on the device and after a CMP process has been performed to remove excess amounts of the layer of insulating material 120. The CMP process exposes the upper surfaces 117S of the cap layers 117 and spacers 116 for further processing. The portions of the layer of insulating material 120 may have a width 120X that may be as small as about 10 nm, depending upon the gate pitch 113P of the gate structures on the device 100. Additionally, the height or thickness 120Y of the layer of insulating material 120 may vary depending upon the application, e.g., 15-50 nm.

Figure 2E:
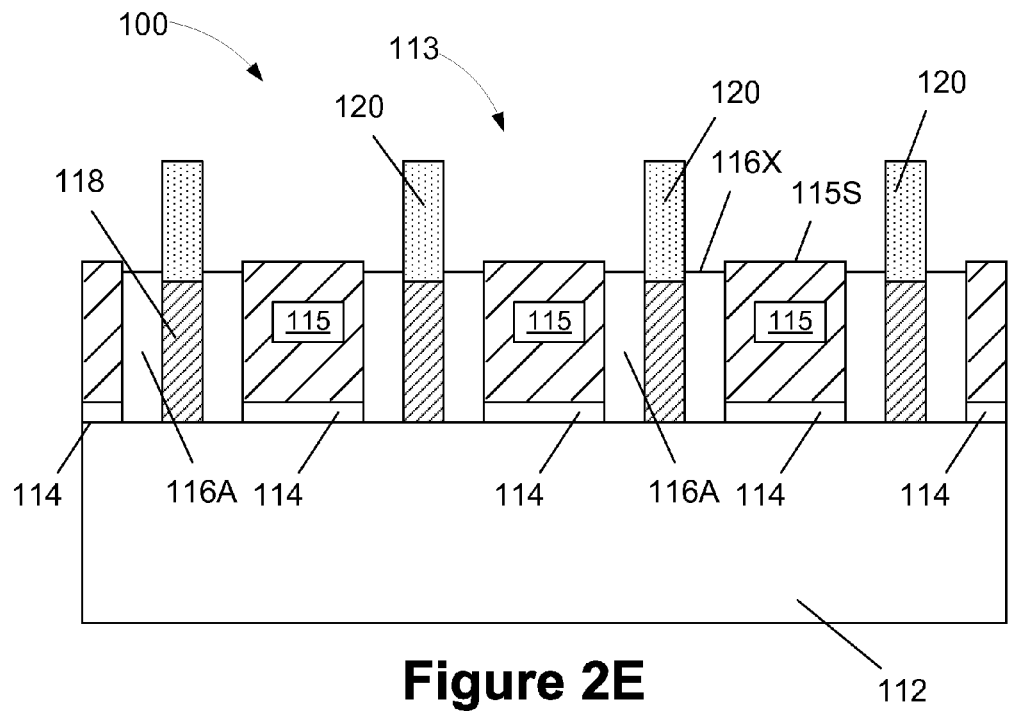

FIG. 2E depicts the device 100 after an etching process has been performed to remove the gate cap layers 117 and portions of the sidewall spacers 116. The etching process is performed for a sufficient duration such that the upper surface 116X of the spacers 116 is below the upper surface 115S of the sacrificial gate electrode 115. This etching process results in the definition of reduced-height sidewall spacers 116A.

Figure 2F:
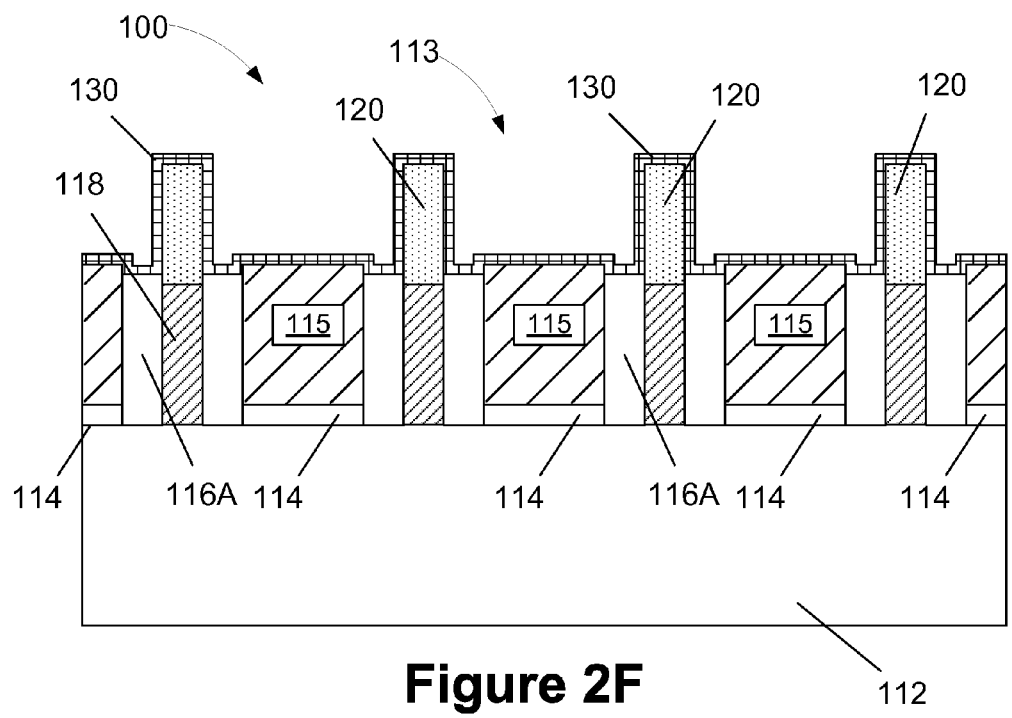
Figure 2G:
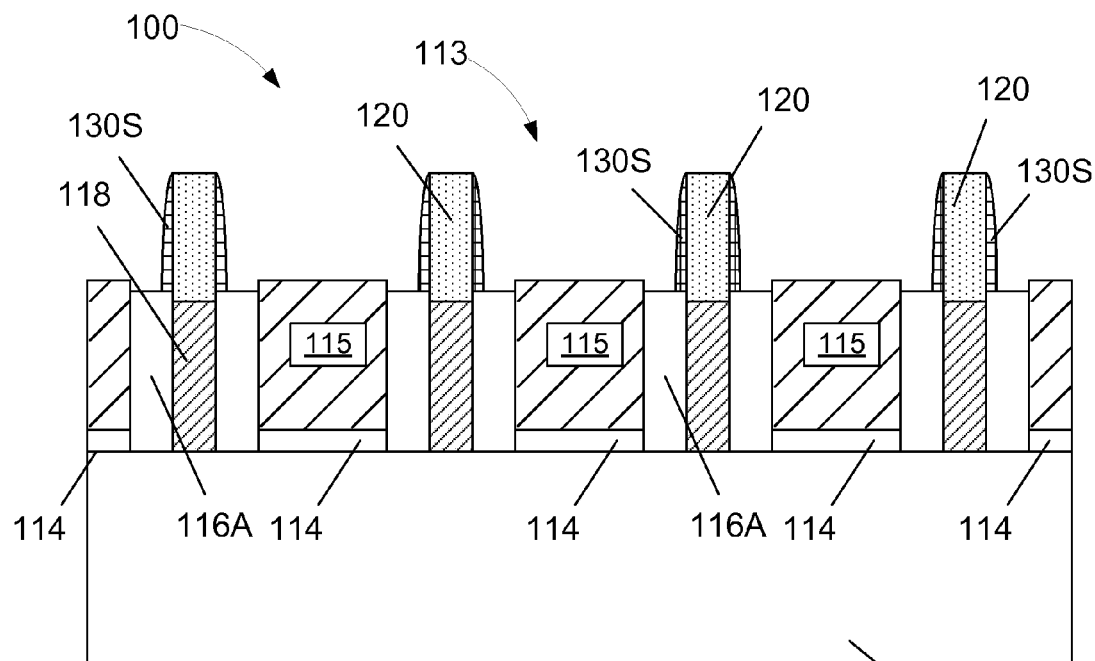

FIG. 2F-2G depict the device 100 after sidewall spacers 130S have been formed on the exposed upstanding portions of the layer of insulating material 120 that were previously covered by the removed portions of the sidewall spacers 116. In one embodiment, the spacers 130S contact the underlying reduced-height sidewall spacer 116A. The process begins by depositing a layer of spacer material 130 (see FIG. 2F) and thereafter performing an anisotropic etching process to define the spacer 130S. The sidewall spacer 130S may be comprised of a variety of different materials, e.g., silicon nitride, silicon carbon nitride, silicon carbon boron nitride, etc. In general, the material selected for the spacer 130S should be a material that will withstand the etching processes that are performed to remove the sacrificial gate structures and the pre-clean process, typically using dilute HF acid, that is performed prior to forming replacement gate structures on the device 100. The base thickness of the sidewall spacer 130 may vary depending upon the particular application. In one illustrative embodiment, the sidewall spacer 130 may have a thickness at its base of about 5-10 nm. The width of the spacers 130S at their base may or may not be sufficient to cover the entire width 120X (see FIG. 2D) of the reduced-height sidewall spacers 116A, e.g., the base width of the spacer 130S may be less than the width 120X. After the formation of the spacers 130, the sacrificial gate electrodes 115 remain exposed for further processing.

Figure 2H:
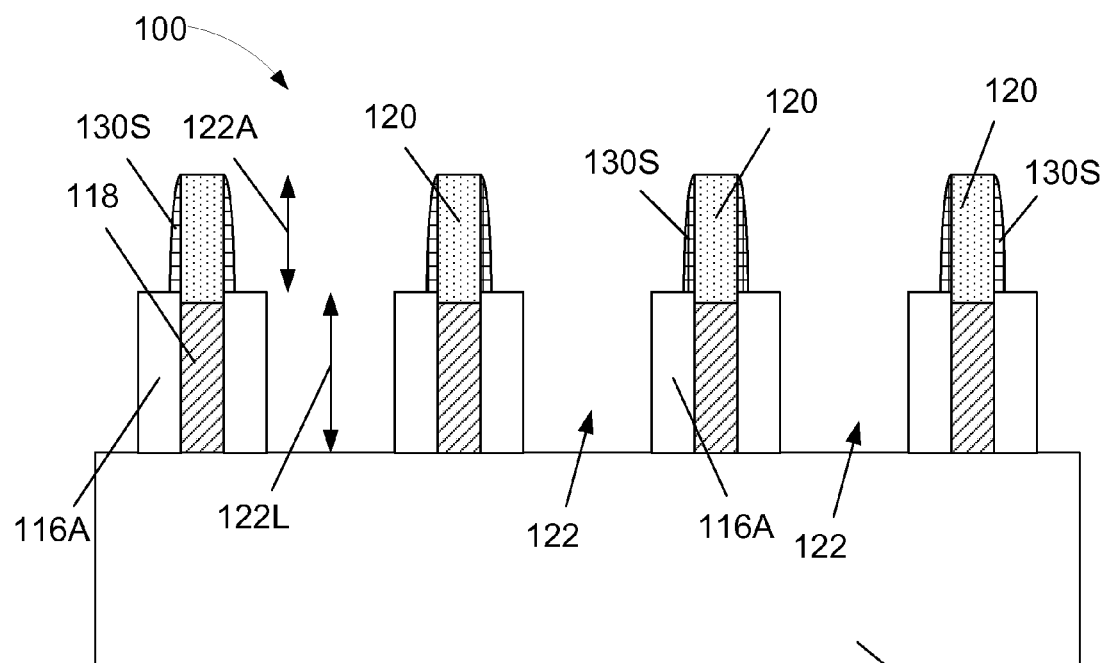

FIG. 2H depicts the device 100 after one or more etching processes have been performed to remove the sacrificial gate electrodes 115 and the sacrificial gate insulation layers 114 to thereby define a plurality of gate cavities 122 where replacement gate structures will subsequently be formed. In the embodiment shown in FIG. 2H, a first, upper portion 122A of the gate cavity 122 has a width that is laterally defined by the spacers 130S while a lower portion 122L of the gate cavity 122 has a width that is laterally defined by the thickness of the original spacers 116. Typically, the sacrificial gate insulation layer 114 is removed as part of the replacement gate technique, as depicted herein. However, the sacrificial gate insulation layer 114 may not be removed in all applications. Even in cases where the sacrificial gate insulation layer 114 is intentionally removed, there will typically be a very thin native oxide layer (not shown) that forms on the substrate 112 within the gate cavities 122.

Figure 2I:
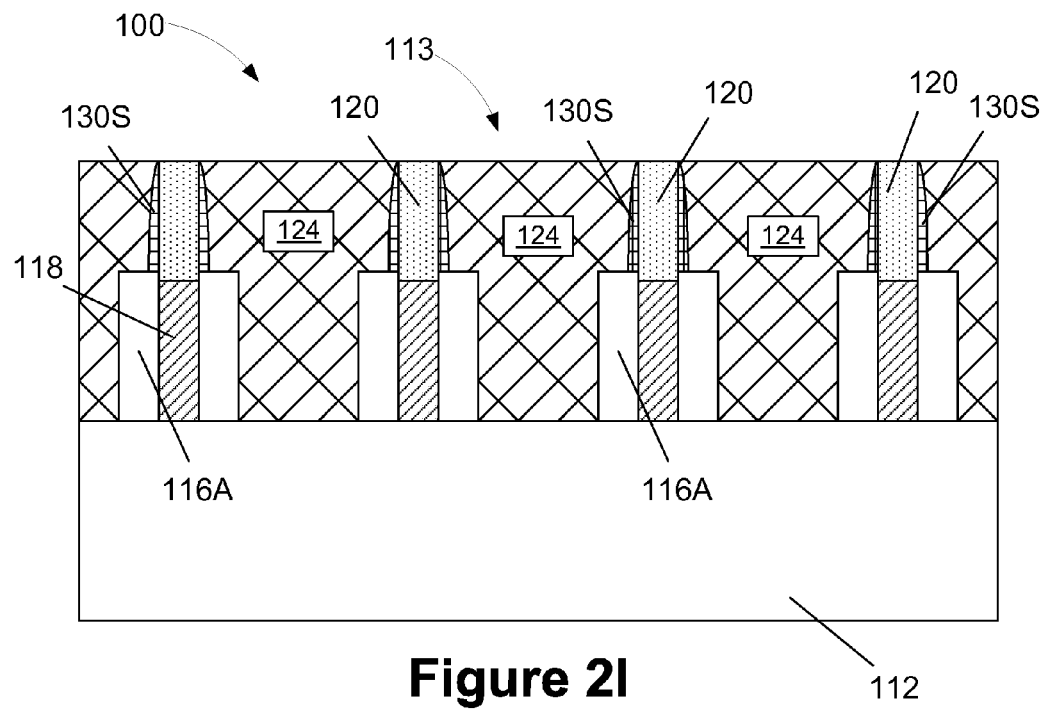

FIG. 2I depicts the device 100 after schematically depicted replacement gate structures 124 have been formed in the gate cavities 122. As part of the process of forming the replacement gate structures 124, the device will typically be subjected to a pre-clean process to insure that all non-desired materials are removed from the surface of the substrate 112 prior to forming the layers of material that will be part of the replacement gate structure 124. As noted above, this pre-clean process is performed with HF acid. Note that, using the novel process flow disclosed herein, the spacers 130S protect the upstanding portions of the layer of insulating material 120 during this pre-clean process. Accordingly, the insulating material 120 is less likely to be significantly degraded during the HF pre-clean process. By protecting the insulating material 120, the problems identified in the background section of the application may be avoided or reduced. At the point of fabrication depicted in FIG. 2I, traditional manufacturing operations may be performed to complete the formation of the device 100. For example, to form self-aligned contacts, the replacement gate structures 124 could be further recessed and re-filled with dielectric cap material. Additionally, various metallization layers may be subsequently formed above the device 100 using known processing techniques.

Figure 3A:
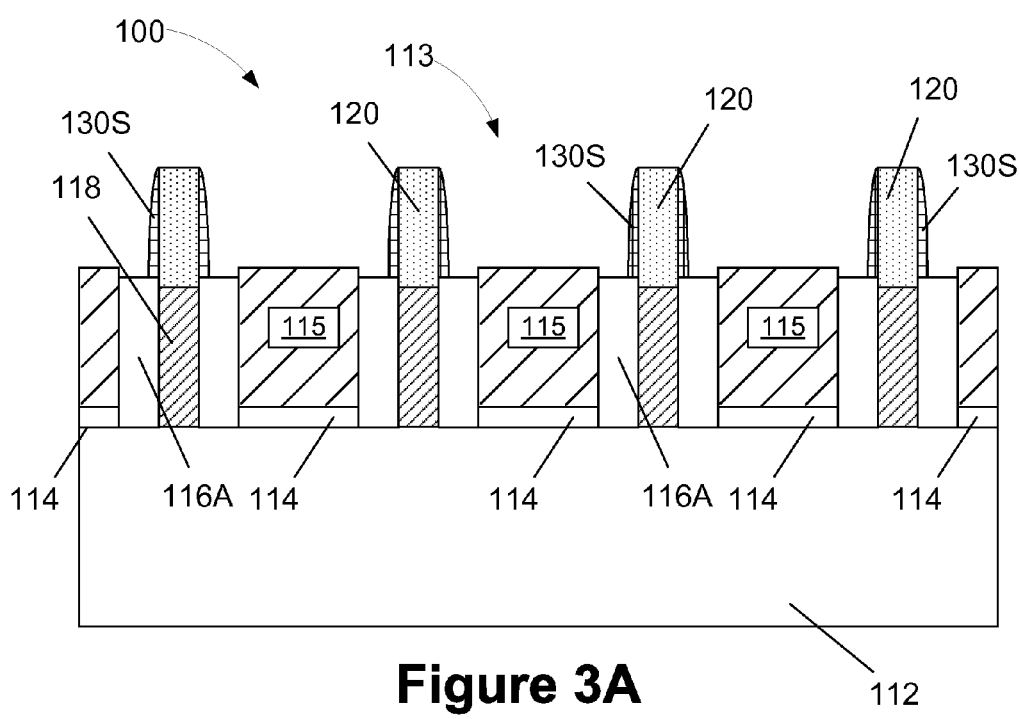
Figure 3B:
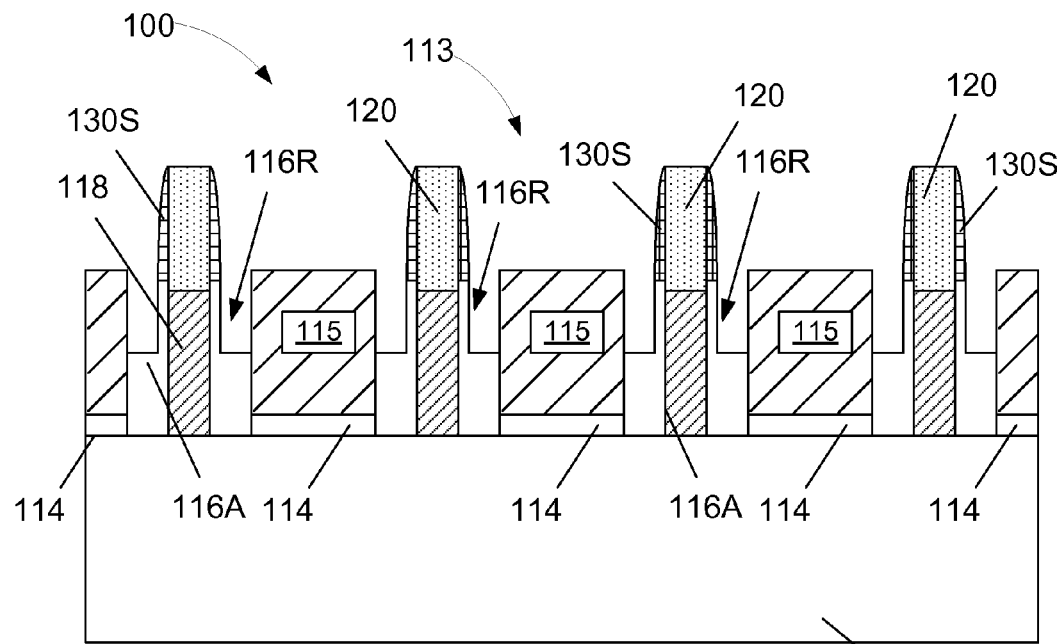

FIGS. 3A-3D depict another illustrative process flow disclosed herein form forming replacement gate structures on integrated circuit devices. FIG. 3A corresponds to the point of fabrication shown in FIG. 2G, i.e., after the formation of the spacers 130S. As shown in FIG. 3B, with the spacers 130S in position, an etching process is performed to form a recess 116R in the reduced-height spacers 116A. The depth and width of the recesses 116R may vary depending upon the particular application, e.g., the vertical depth of the recesses 116R may be about 10-30 nm, while the lateral width of the recesses 116R may be about 5-10 nm. Note that in the depicted embodiment, the recesses 116R are self-aligned with respect to the sidewall spacers 130S.

Figure 3C:
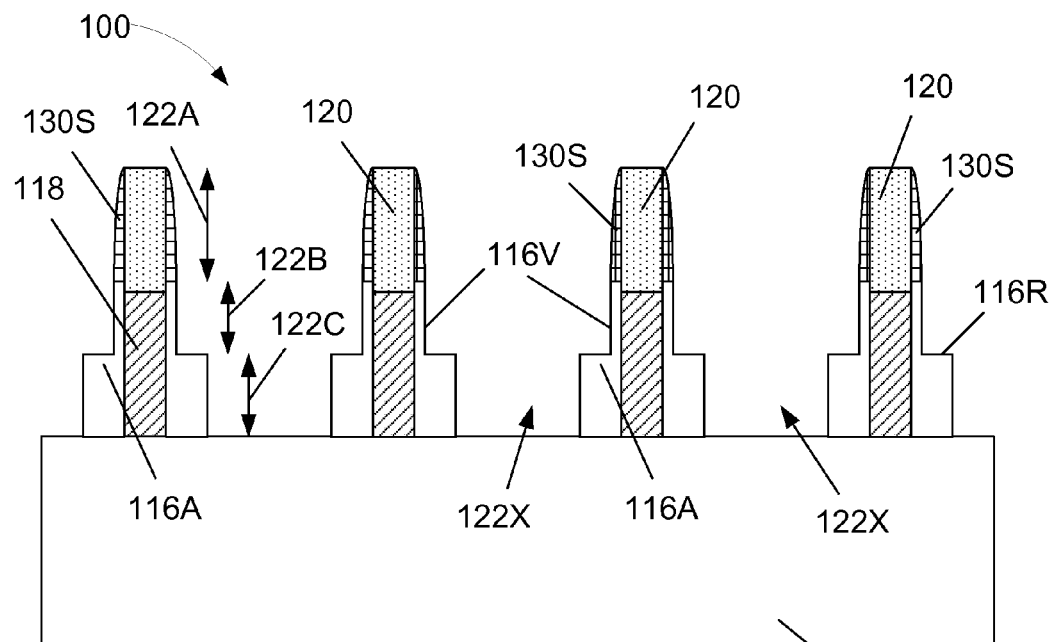

FIG. 3C depicts the device 100 after one or more etching processes have been performed to remove the sacrificial gate electrodes 115 and the sacrificial gate insulation layers 114 to thereby define a plurality of gate cavities 122X where replacement gate structures will subsequently be formed. By forming the recesses 116R in the reduced-height spacers 116A, the width or size of the gate cavities 122X is effectively increased (relative to the gate cavities 122 described above), thereby making the filling of the gate cavities 122X with the multiple layers of material that will make up the replacement gate structure easier and less likely to create undesirable voids. Stated more specifically, in the embodiment shown in FIGS. 3C-3D, the first, upper portion 122A of the gate cavity 122X has a width that is laterally defined by the spacers 130S, a second, intermediate portion 122B of the gate cavity 122X has a width that is laterally defined by the inner, substantially vertically oriented surfaces 116V of the recesses 116R formed in the reduced-height spacers 116A and a third, lower portion 122C of the gate cavity. In embodiments, the width of the gate cavities 122, 122X between the spacers 130S, may be about the same. Similarly, the width of the gate cavities 122, 122X between the full thickness reduced-height spacers 116A, i.e., in the region right above the surface of the substrate 112, may be about the same.

FIG. 3D depicts the device 100 after schematically depicted replacement gate structures 124A have been formed in the gate cavities 122X. As part of the process of forming the replacement gate structures 124A, the device will typically be subjected to the previously mentioned HF acid pre-clean process to insure that all non-desired materials are removed from the surface of the substrate 112 prior to forming the layers of material that will be part of the replacement gate structure 124A. During this process, as with the previous process flow, the spacers 130S protect the upstanding portions of the layer of insulating material 120 during this pre-clean process. At the point of fabrication depicted in FIG. 3D, traditional manufacturing operations may be performed to complete the formation of the device 100. For example, to form self-aligned contacts, the replacement gate structures 124A could be further recessed and re-filled with dielectric cap material. Additionally, various metallization layers may be subsequently formed above the device 100 using known processing techniques.

The materials used for such replacement gate structures 124, 124A may vary depending upon the particular application. In one illustrative example, the replacement gate structures 124, 124A are each comprised of a high-k gate insulation layer, such as hafnium oxide, and one or more layers of metal. The layers of material that comprise the replacement gate structures 124, 124A are sequentially deposited in the gate cavities 122, 122X and one or more CMP processes are performed to remove excess portions of these layers of material to thereby arrive at the replacement gate structures 124, 124A depicted herein.

FIGS. 4A and 4B are cross-sectional drawings of individual replacement gate structures 124, 124A made using the illustrative methods disclosed above in FIGS. 2A-2I and 3A-3D, respectively. In both embodiments, the internal spacers 130S are formed between the replacement gate structures and the layer of insulating material 120. In FIG. 4B, due to the formation of the recesses 116R, the gate cavity 122X has a more tapered configuration that should facilitate filling the gate cavity 122X with the materials used for the replacement gate structure 124A. In effect, by forming the recesses 116R in the spacers 116, the vertical location where there is a significant inward narrowing of the gate cavity 122X due to the presence of the full width of the reduced-height spacer 116A is moved closer to the substrate 112, i.e., compare the location of the top surface 116T of the reduced-height spacer 116A (in the region indicated by dashed line 141A) and the location of the bottom surface 116B of the recesses 116R (in the region indicated by dashed line 141B). Thus, in the region 140B, the gate cavity 122X and resulting replacement gate structure 124A is more tapered as compared to corresponding region 140A of the gate cavity 122 and the replacement gate structure 124 formed when using the method shown in FIGS. 2A-2I. Also note that, in both of the replacement gate structures 124, 124A, the spacer 130S is positioned between the upper portion of the gate structures 124, 124A and the layer of insulating material 120. In general, the gate structures 124, 124A will have a configuration that substantially mirrors that of the corresponding gate cavities 122, 122X, respectively. When it is stated herein and/or in the claims that a portion of a "replacement gate structure" is positioned relative to or between other structures, such as the spacers 130S, it should be understood that such language is intended to include situations where any portion of any layer of insulating material or any layer of conductive material in the replacement gate structure is positioned relative to or between the other structures, i.e., it is not required that all of the various layers of material that comprise the replacement gate structure be positioned as indicated herein and/or in the claims.

As is clear from the foregoing, in one broad aspect, the device disclosed herein includes first and second spaced-apart portions of a first layer of insulating material 120 positioned above a substrate 112, a gate structure 124, 124A positioned above the substrate between the first and second spaced-apart portions of the first layer of insulating material 120, a plurality of first sidewall spacers 130S, each of which are positioned between the gate structure 124, 124A and on one of the first and second spaced-apart portions of the first layer of insulating material 120 and a second sidewall spacer 116A positioned below each of the first sidewall spacers 130S, wherein the first sidewall spacer 130S contacts the second sidewall spacer 116A.

As noted above, the replacement gate structures 124, 124A depicted in the drawings are intended to be representative in nature. For example, the gate insulation layer in such replacement gate structures may be comprised of a variety of different materials, such as, for example, silicon dioxide, a so-called high-k (k greater than 10) insulation material (where k is the relative dielectric constant), etc. The gate electrode in such replacement gate structures may be comprised of one or more layers of conductive material, e.g., polysilicon, tungsten, aluminum, one or more layers of metal, etc. In some cases, if desired, a metal layer, such as a very thin work function adjusting metal (e.g., a layer of titanium nitride), may be formed on the high-k gate insulation layer. As will be recognized by those skilled in the art after a complete reading of the present application, the insulating materials and the metal layer(s) that are part of the replacement gate structures 124, 124A may be of any desired construction and comprised of any of a variety of different materials. Additionally, the replacement gate structures 124, 124A for an NFET device may have different material combinations as compared to the replacement gate structures 124, 124A for a PFET device. Thus, the particular details of construction of the replacement gate structures 124, 124A and the manner in which such replacement gate structures 124, 124A are formed should not be considered a limitation of the present invention unless such limitations are expressly recited in the attached claims.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a sacrificial gate structure and a gate cap layer above said sacrificial gate structure;
    forming first sidewall spacers adjacent opposite sides of said sacrificial gate structure and said gate cap layer;
    forming a layer of insulating material adjacent each of said first sidewall spacers;
    performing at least one etching process to remove said gate cap layer and a portion of said first sidewall spacers so as to expose portions of said layer of insulating material and to define reduced-height first sidewall spacers;
    forming second sidewall spacers on said exposed portions of said layer of insulating material, wherein each of said second sidewall spacers is positioned above one of said reduced-height first sidewall spacers;
    after forming said second sidewall spacers, removing said sacrificial gate structure to thereby define a gate cavity, whereby a portion of said gate cavity is laterally defined by said second sidewall spacers; and
    forming a replacement gate structure in said gate cavity, wherein at least a first portion of said replacement gate structure is positioned between said second sidewall spacers.

2. The method of claim 1, wherein said first sidewall spacers and said gate cap layer are comprised of silicon nitride.

3. The method of claim 1, wherein said second sidewall spacers are comprised of silicon nitride, silicon carbon or silicon carbon boron nitride.

4. The method of claim 1, wherein said layer of insulating material is comprised of a flowable silicon dioxide material.

5. The method of claim 1, wherein said replacement gate structure comprises a gate insulation layer comprised of a high-k insulating material and a gate electrode comprised of at least one layer of metal.

6. The method of claim 1, wherein said step of removing at least said sacrificial gate structure comprises performing at least one etching process to remove said sacrificial gate structure.

7. The method of claim 1, wherein, after forming said second sidewall spacers, performing an etching process on said reduced-height first sidewall spacers to form a recess in said reduced-height first sidewall spacers, wherein said recess is self-aligned with respect to said second sidewall spacers, and wherein said step of removing said sacrificial gate structure is performed after said recess is formed in said first sidewall spacers.

8. The method claim 7, wherein at least a second portion of said replacement gate structure is positioned between said recesses in said first sidewall spacers.

9. The method of claim 1, wherein each of said second sidewall spacers contacts one of said reduced-height sidewall spacers.

10. A method, comprising:
    forming a sacrificial gate structure and a gate cap layer above said sacrificial gate structure;
    forming first sidewall spacers adjacent opposite sides of said sacrificial gate structure and said gate cap layer;
    forming a layer of insulating material adjacent each of said first sidewall spacers;
    performing at least one etching process to remove said gate cap layer and a portion of said first sidewall spacers so as to expose portions of said layer of insulating material and to define reduced-height first sidewall spacers;
    forming second sidewall spacers on said exposed portions of said layer of insulating material, wherein each of said second sidewall spacers is positioned above one of said reduced-height first sidewall spacers;
    after forming said second sidewall spacers, performing an etching process on said reduced-height first sidewall spacers to form a recess in said reduced-height first sidewall spacers, wherein said recess is self-aligned with respect to said second sidewall spacers;
    after forming recesses in said reduced-height first sidewall spacers, removing said sacrificial gate structure to thereby define a gate cavity, whereby a first portion of said gate cavity is laterally defined by said second sidewall spacers and a second portion of said gate cavity is laterally defined by said recesses; and
    forming a replacement gate structure in said gate cavity, wherein at least a first portion of said replacement gate structure is positioned between said second sidewall spacers and a second portion of said replacement gate structure is positioned between said recesses.

11. The method of claim 10, wherein said each of said second sidewall spacers contacts one of said reduced-height sidewall spacers.

12. The method of claim 11, wherein said gate cap layer is comprised of silicon nitride.

13. The method of claim 10, wherein said sacrificial gate structure is comprised of a silicon dioxide gate insulation layer and a polysilicon gate electrode positioned above said gate insulation layer.

14. The method of claim 10, wherein said replacement gate structure comprises a gate insulation layer comprised of a high-k insulating material and a gate electrode comprised of at least one layer of metal.

15. The method of claim 10, wherein said step of removing at least said sacrificial gate electrode comprises performing at least one etching process to remove at least said sacrificial gate electrode.

\* \* \* \* \*